(12) United States Patent
Huang

(10) Patent No.: US 11,063,552 B2
(45) Date of Patent: Jul. 13, 2021

(54) SOLAR MODULE

(71) Applicant: HELIARTEC SOLUTIONS CORPORATION, LTD., Hsinchu County (TW)

(72) Inventor: Ting-Hui Huang, Hsinchu County (TW)

(73) Assignee: HELIARTEC SOLUTIONS CORPORATION, LTD., Hsinchu County (TW)

( * ) Notice: Subject to any disclaimer, the term of this patent is extended or adjusted under 35 U.S.C. 154(b) by 0 days.

(21) Appl. No.: 15/790,669

(22) Filed: Oct. 23, 2017

(65) Prior Publication Data

US 2019/0036475 A1    Jan. 31, 2019

(30) Foreign Application Priority Data

Jul. 25, 2017   (TW) .................................. 106124903

(51) Int. Cl.
*H02S 20/26*     (2014.01)
*H01L 31/048*    (2014.01)
*H02S 40/20*     (2014.01)
*H01L 31/0216*   (2014.01)

(52) U.S. Cl.
CPC ........ *H02S 20/26* (2014.12); *H01L 31/02164* (2013.01); *H01L 31/02167* (2013.01); *H01L 31/048* (2013.01); *H01L 31/0488* (2013.01); *H02S 40/20* (2014.12)

(58) Field of Classification Search
CPC ............. H01L 31/0322; H01L 31/0323; H01L 31/0749; H01L 31/0445; H01L 31/0465; H01L 31/02363; H01L 31/0236; H01L 31/054–056; H01L 31/0488;
(Continued)

(56) References Cited

U.S. PATENT DOCUMENTS 4,321,417 A * 3/1982 Kurth ................... H01L 31/048
                                                        136/246
4,908,395 A * 3/1990 Kurita ................... C08F 299/08
                                                          522/42
(Continued)

FOREIGN PATENT DOCUMENTS

CN    102017173 A     4/2011
JP    11-298029       10/1999
(Continued)

OTHER PUBLICATIONS

Definition of "glaze" [retrieved from https://www.collinsdictionary.com/dictionary/english/glaze on Mar. 8, 2021].*
(Continued)

*Primary Examiner* — Eric S Smith
(74) *Attorney, Agent, or Firm* — Behmke Innovation Group LLC; James M. Behmke; Jonathon P. Western

(57) ABSTRACT

The present disclosure provides a solar module including an encapsulation layer, a plurality of solar cells embedded in the encapsulation layer with gaps between the solar cells; and a first patterned layer formed on the encapsulation layer and corresponding to locations of the gaps so as to absorb the light penetrating through the gaps, thereby shielding buildings from sunlight and thus saving energy.

7 Claims, 2 Drawing Sheets

(58) Field of Classification Search
CPC ............... H01L 31/0481; H01L 31/043; H01L 31/048–31/049; H02S 20/26; H02S 40/22
USPC .................................. 52/173.3; 136/243–265
See application file for complete search history.

(56) References Cited

U.S. PATENT DOCUMENTS

| | | | | |
|---|---|---|---|---|
| 5,011,544 A * | 4/1991 | Gaddy | ................... | H01L 31/042 136/244 |
| 5,149,351 A * | 9/1992 | Yaba | ..................... | B60J 7/04 257/E27.125 |
| 5,259,891 A * | 11/1993 | Matsuyama | ...... | H01L 31/03921 136/244 |
| 5,725,006 A * | 3/1998 | Kawama | ............. | H01L 31/0236 136/251 |
| 6,538,192 B1 * | 3/2003 | Coster | ............... | B32B 17/10036 136/251 |
| 9,929,296 B1 * | 3/2018 | Rose | ..................... | H01L 31/056 |
| 2002/0153038 A1 * | 10/2002 | Umemoto | ............... | B32B 17/10 136/251 |
| 2004/0084078 A1 * | 5/2004 | Yoshida | .................. | H02S 20/00 136/251 |
| 2004/0182432 A1 * | 9/2004 | Yoda | ..................... | H01L 31/048 136/244 |
| 2009/0078250 A1 * | 3/2009 | Ishii | .................... | H01L 31/0488 126/704 |
| 2009/0133739 A1 * | 5/2009 | Shiao | .................. | H01L 31/048 136/251 |
| 2009/0178704 A1 * | 7/2009 | Kalejs | ............... | B32B 17/10743 136/246 |
| 2010/0037945 A1 * | 2/2010 | Tsunoda | ............ | B32B 17/10036 136/256 |
| 2011/0297207 A1 * | 12/2011 | Ishihara | ................ | H01L 31/048 136/246 |
| 2011/0303275 A1 * | 12/2011 | Lin | ...................... | H01L 31/048 136/256 |
| 2012/0103397 A1 * | 5/2012 | Damm | .............. | B32B 17/10302 136/251 |
| 2012/0247541 A1 * | 10/2012 | Wootton | .............. | H01L 21/0262 136/251 |
| 2013/0118548 A1 * | 5/2013 | Giri | .................. | H01L 31/022425 136/246 |
| 2013/0213472 A1 * | 8/2013 | Powell | ................ | H01L 31/0392 136/257 |
| 2014/0007918 A1 * | 1/2014 | Lee | ...................... | H01L 31/0527 136/246 |
| 2014/0116495 A1 * | 5/2014 | Kim | ......................... | H02S 40/22 136/246 |
| 2015/0171252 A1 * | 6/2015 | Lee | .......................... | H02S 40/22 136/259 |
| 2016/0315209 A1 | 10/2016 | Wang et al. | | |
| 2017/0148942 A1 * | 5/2017 | Van Roosmalen | .......................... | H01L 31/0508 |

FOREIGN PATENT DOCUMENTS

| | | |
|---|---|---|
| JP | 2013-145810 A | 7/2013 |
| JP | 2013-206926 A | 10/2013 |
| JP | 2013-229576 A | 11/2013 |
| JP | 2016-063019 A | 4/2016 |
| TW | 200847456 A | 12/2008 |
| TW | 201403845 A | 1/2014 |
| TW | 201721896 A | 6/2017 |
| WO | WO-2016162742 A1 * | 10/2016 ........... H01L 31/048 |

OTHER PUBLICATIONS

Japanese Office Action dated Jul. 23, 2018 in connection with Japanese Applicaton No. 2016-201162.
Taiwanese Office Action dated Sep. 13, 2013 in connection with Taiwanese Application No. 106124903.

* cited by examiner

SOLAR MODULE

RELATED APPLICATION

This application claims the benefit of Taiwanese Patent Application No. 106124903, filed on Jul. 25, 2017, the entire content of which is incorporated herein.

BACKGROUND

1. Technical Field

The present disclosure relates to solar modules, and, more particularly, to a solar module integrated with a plurality of solar cells.

2. Description of Related Art

Silicon building-integrated photovoltaics (BIPV) solar modules mounted on facades of a building generally require high durability and safety, and have to have smooth pattern appearance in order to meet the quality requirements of the building.

As shown in FIG. 1A, a conventional silicon solar module 1 uses a glass cover 12 and a back sheet 10 to encapsulate solar cells 13 that are stringed together via soldering in a transparent or partially white encapsulation layer 10. Then, the package is bonded to an aluminum frame 15 at its periphery via foam tapes 14. The encapsulation layer 10 may be made of ethylene vinyl acetate (EVA) or polyvinyl butyral (PVB), for example.

However, in terms of durability and safety, the solar module 1 does not meet the requirements for mounting on the facades of a building. For example, after long-term use of the solar module 1, the back sheet 11 is prone to weathering, causing the solar module 1 to be damaged. Also, the back sheet 11 of the solar module 1 can easily catch fire.

Therefore, a solar module 1' is developed by replacing the back sheet with a glass plate 11', as shown in FIG. 1B. The solar module 1' has a double-glass structure. In specific, the glass cover 12 and the glass plate 11' are used to encapsulate the stringed solar cells 13 in the encapsulation layer 10, so as to reduce weathering and prolong its service life to equal the service lives of other building materials. Moreover, the structural safety is improved by reducing the risk of the materials in catching fire.

However, when the solar module 1' is mounted on a building, light will pass through gaps w between the solar cells 13 to irradiate on the walls of the building via the glass plate 11'. As a result, regardless of whether a transparent or partially white encapsulation layer 10 is used, the lattice pattern of the solar cells 13 will inevitably appear on the building, which may reduce the aesthetic appeal of the building. Furthermore, the encapsulation layer 10 may turn yellow due to prolonged exposure to ultraviolet rays, which gives an undesirable aging look to the building.

Furthermore, the size of the solar module 1' for a facade of a building has to meet the building specifications that are generally in a size of 600 mm×1200 mm or 900 mm×1800 mm. However, these are not the standard sizes of a conventional silicon solar module (e.g., 1656 mm×992 mm for 60 solar cells or 1956 mm×992 mm for 72 solar cells). Thus, when a transparent or partially white encapsulation layer 10 is used, sunlight can penetrate large areas of the solar module 1' (via the gaps w between the solar cells 13) to arrive at the exterior walls of the building, which makes the solar module 1' less effective in shielding the external walls of the building, resulting in increase in the temperature of the building and consequently the amount electricity used for air conditioning (or air conditioners). As a result, energy consumption (e.g., the amount of electricity used for air conditioning) of the building accounts for a significant percentage of the total energy consumption (around 24% or more). This fails to satisfy the demand for energy saving.

Therefore, there is a need for a solution that addresses the shortcomings of conventional commercial solar modules or BIPV solar modules in the prior art.

SUMMARY

In view of the aforementioned shortcomings of the prior art, the present disclosure provides a solar module, which may include an encapsulation layer including a first surface and a second surface opposite to the first surface; a plurality of solar cells embedded in the encapsulation layer with gaps between the solar cells; and a first patterned layer bonded to the first surface of the encapsulation layer and corresponding to locations of the gaps.

In an embodiment, the solar cells are electrically connected in series.

In an embodiment, the solar module further includes a first transparent board bonded to the first surface of the encapsulation layer and the first patterned layer.

In an embodiment, the solar module further includes a second transparent board bonded to the second surface of the encapsulation layer.

In an embodiment, the solar module further includes a second patterned layer bonded to at least one of the first surface and the second surface of the encapsulation layer and located on an edge of the encapsulation layer. In another embodiment, the first patterned layer and the second patterned layer are made of the same material. In yet another embodiment, the first patterned layer, the second patterned layer and the solar cells have the same patterns and colors.

In an embodiment, the solar module further includes a sealing material provided at a periphery of the encapsulation layer and corresponding to the patterns on the second patterned layer to at least partially overlap the patterns on the second patterned layer. In another embodiment, the sealing material and the solar cells are spaced apart at another gap. In yet another embodiment, the second patterned layer has a greater coating area than the sealing material, and the second patterned layer shields the another gap.

It can be understood from the above that when the solar module according to the present disclosure is mounted on a building, since the patterns on the first patterned layer are located corresponding to the locations of the gaps of adjacent solar cells and absorb light passing through the gaps, light can be prevented from reaching the transparent board on the first surface of the encapsulation layer, thereby shielding the exterior walls of the building. Therefore, as compared to the prior art, the solar module according to the present disclosure is able to reduce the temperature of the walls during sunny days, which consequently reduces the amount of electricity used for air conditioning (or air conditioners), thereby effectively reducing the energy consumption of the building as a percentage of the total energy consumption to save energy.

Moreover, with the provision of the first patterned layer and the second patterned layer, the solar module does not appear to exhibit the lattice structure of the solar cells, which makes the building more aesthetically pleasing.

Furthermore, since the first patterned layer and the second patterned layer are capable of absorbing light passing through the gaps, ultraviolet rays irradiating on the encapsulation layer can be reduced, which slows the yellowing process of the encapsulation layer. As compared to the prior art, the solar module according to the present disclosure is capable to slowing the "aging" speed of the building.

DETAILED DESCRIPTION OF THE EMBODIMENTS

Figure 1A:
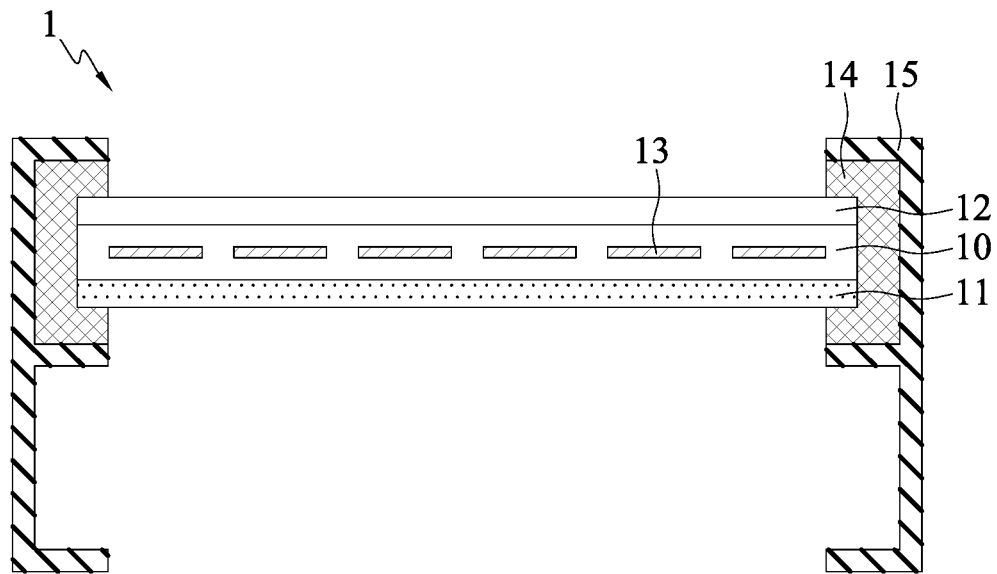
FIG. 1A is a cross-sectional diagram depicting a conventional solar module.
Figure 1B:
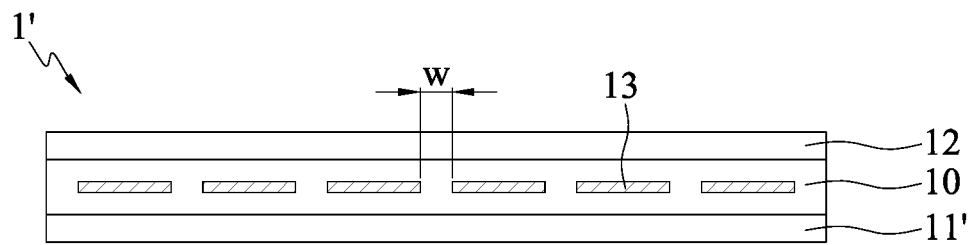
FIG. 1B is a cross-sectional diagram depicting another type of a conventional solar module.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "a", "an" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2:
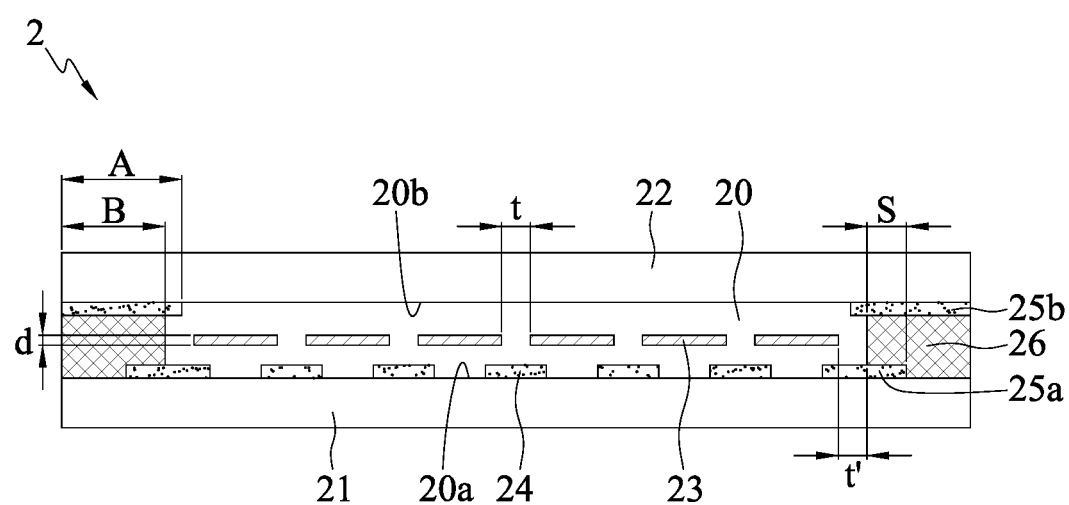
FIG. 2 is a cross-sectional diagram depicting a solar module in accordance with the present disclosure.

FIG. 2 is a cross-sectional diagram depicting a solar module 2 in accordance with the present disclosure. The solar module 2 includes an encapsulation layer 20, a first transparent board 21, a second transparent board 22, a plurality of solar cells 23, a first patterned layer 24, second patterned layers 25a and 25b, and a sealing material 26.

The encapsulation layer 20 includes a first surface 20a and a second surface 20b opposite to the first surface 20a. In an embodiment, the encapsulation layer 20 is made of a transparent, semi-transparent or partially white material, such as ethylene vinyl acetate (EVA), polyvinyl butyral (PVB), or polyolefin (PO), but the present disclosure is not so limited.

The solar cells 23 are separately embedded in the encapsulation layer 20, such that there are gaps t between the solar cells 23. The solar cells 23 are electrically connected in series by soldering a plurality of wires (not shown).

The first patterned layer 24 is provided on the first surface 20a of the encapsulation layer 20 and corresponds to the locations of the gaps t.

In an embodiment, the first patterned layer 24 may be made of a glaze.

The first transparent board 21 may be a glass plate or be made of other suitable materials, and is bonded to the first surface 20a of the encapsulation layer 20 and the first patterned layer 24.

The second transparent board 22 may be a glass plate or be made of other suitable materials, and is bonded to the second surface 20b of the encapsulation layer 20 and the first patterned layer 24.

The second transparent board 22 is a front board that allows light to pass through and reach the solar cells 23. The first transparent board 21 is a back board.

Therefore, with a design of the double-glass packaging structure (i.e., the first transparent board 21 and the second transparent board 22), not only the service life of the solar module 2 is increased to be similar to the service lives of other building materials (e.g., at least 50 years), weathering is also reduced. Moreover, the structural safety is improved, reducing the risk of catching fire.

The second patterned layers 25a and 25b are provided on the first surface 20a and the second surface 20b of the encapsulation layer 20 and are located on the edges of the encapsulation layer 20.

In an embodiment, the second patterned layers 25a and 25b are made of a similar material to the first patterned layer 24. In another embodiment, the patterns and colors of the glazes of the second patterned layers 25a and 25b are the same as those of the solar cells 23, thereby giving a uniform look to the exterior of the solar module 2 and significantly enhancing the aesthetic appeal of a building on which the solar module 2 is installed.

The sealing material 26 (e.g., a waterproof material) surrounds the periphery of the encapsulation layer 20, forming a waterproof ring, for example. The sealing material 26 corresponds to the locations of the second patterned layers 25a and 25b, such that the sealing material 26 partially overlaps the second patterned layers 25a and 25b, as shown by overlap areas S in FIG. 2. The encapsulation layer 20 and the sealing material 26 are sandwiched between the first transparent board 21 and the second transparent board 22, wherein the overlap areas S include the first transparent board 21 and the second patterned layers 25a thereon, the sealing material 26, and the second transparent board 22 and the second patterned layer 25b thereon.

In an embodiment, the sealing material 26 is, for example, a butyl adhesive, which appears to be black.

Moreover, the sealing material 26 is in contact with the second patterned layers 25a and 25b, but not the solar cells 23, so that gaps t' exist between the sealing material 26 and the solar cells 23, wherein the gaps t' are greater than the thickness d of the solar cells 23.

Furthermore, the second patterned layer 25b on the second transparent board 22 is used for shielding the sealing material 26, so the coating area A of the glaze of the second patterned layer 25b should be greater than or equal to the coating area B of the sealing material 26. Thus, the sealing material 26 is shielded by the second patterned layer 25b on the second transparent board 22 to avoid the periphery the solar module 2 from appearing black and spoil the look of the solar module 2. In addition, the second patterned layers 25a and 25b on the first transparent board 21 (or the second patterned layer 25b on the second transparent board 22) is further used for shielding the gaps t' between the sealing material 26 and the solar cells 23, so that light does not pass through the first transparent board 21 via the gaps t'.

Since the sealing material 26 is chosen to be waterproof, the integrity of the encapsulation layer 20 can be ensured for years of use without peeling off. Also, degradation of power generation efficiency of the solar cells 23 can be eliminated by preventing moisture ingress.

A method for fabricating the solar module 2 according to the present disclosure includes providing glazes on a first transparent board 21 and a second transparent board 22 by transferring or spraying and sintering the glazes at a temperature of at least 500° C. to form a first patterned layer 24 and second patterned layers 25a and 25b that are tightly bonded onto the first transparent board 21 and the second transparent board 22. Thereafter, an encapsulant is formed on the first transparent board 21 and the second transparent board 22, solar cells 23 that are stringed together are encapsulated by laminating the encapsulant of the first transparent board 21 and the second transparent board 22 together, and the encapsulant is thermally set to form an encapsulation layer 20 and a ring of sealing material 26 is further laminated, thereby completing the fabrication of the solar module 2.

In conclusion, during use of the solar module 2 according to the present disclosure, since the patterns on the first patterned layer 24 are located corresponding to the locations of the gaps t, while the patterns on the second patterned layers 25a and 25b are located corresponding to the locations of the gaps t', light passing through the gaps t and t' is absorbed before reaching the first transparent board 21, thus the solar module 2 exhibits an opaque look that helps to shield the external walls of the building from sunlight and reduces the temperature of the walls during sunny days, which consequently reduces the amount of electricity used for air conditioning (or air conditioners). Therefore, the solar module 2 of the present disclosure is able to effectively reduce the energy consumption (e.g. the amount of electricity for air conditioning) of the building as a percentage of the total energy consumption to below 24% (conventionally this percentage is above 24%) to save energy.

Moreover, with the provision of the first patterned layer 24 and the second patterned layers 25a and 25b, the solar module 2 does not show the lattice structure of the solar cells 23, which makes the building more aesthetically pleasing.

Furthermore, since the first patterned layer 24 and the second patterned layers 25a and 25b are capable of absorbing light passing through the gaps t and t', ultraviolet rays irradiating on the encapsulation layer 20 can be reduced, which slows the yellowing process of the encapsulation layer 20 and the "aging" of the building.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:
1. A solar module, comprising:
an encapsulation layer including a first surface and a second surface opposite to the first surface;
a plurality of solar cells embedded in the encapsulation layer with gaps between the solar cells;
a first patterned layer made of a glaze bonded to the first surface of the encapsulation layer and corresponding to locations of the gaps allowing light passing through the gaps to be absorbed by the first patterned layer;
a first transparent board bonded to the first surface of the encapsulation layer and the first patterned layer, wherein the first transparent board is in direct contact with the first surface of the encapsulation layer and the first patterned layer;
a second transparent board bonded to the second surface of the encapsulation layer, wherein the second transparent board is in direct contact with the second surface of the encapsulation layer;
a second patterned layer made of the glaze bonded to at least one of the first surface and the second surface of the encapsulation layer, wherein the second patterned layer is located on an edge of the encapsulation layer; and
a sealing material provided at a periphery of the encapsulation layer and between the first transparent board and the second transparent board, wherein the second patterned layer has a coating area greater than or equal to a coating area of the sealing material,
wherein the sealing material is free from being extending out of a lateral surface of the first transparent board and the second transparent board, and
wherein the second patterned layer is formed between the sealing material and the first transparent board and between the sealing material and the second transparent board.

2. The solar module of claim 1, wherein the first patterned layer, the second patterned layer and the solar cells have the same patterns.

3. The solar module of claim 1, wherein the first patterned layer, the second patterned layer and the solar cells have the same colors.

4. The solar module of claim 1, wherein the sealing material is provided corresponding to a location of the second patterned layer to at least partially overlap the second patterned layer.

5. The solar module of claim 1, wherein the sealing material and the solar cells are spaced apart at another gap.

6. The solar module of claim 5, wherein the second patterned layer shields the another gap.

7. The solar module of claim 1, wherein the solar cells are electrically connected in series.

\* \* \* \* \*